Dec. 6, 1966 G. E. THERIAULT 3,290,613

SEMICONDUCTOR SIGNAL TRANSLATING CIRCUIT

Filed Feb. 25, 1963

INVENTOR.
GERALD E. THERIAULT
BY
Eugene M. Whitacre
ATTORNEY

United States Patent Office 3,290,613
Patented Dec. 6, 1966

3,290,613
SEMICONDUCTOR SIGNAL TRANSLATING CIRCUIT
Gerald E. Theriault, Hopewell, N.J., assignor to Radio Corporation of America, a corporation of Delaware
Filed Feb. 25, 1963, Ser. No. 260,452
11 Claims. (Cl. 331—117)

This invention relates in general to electrical circuits employing semiconductor devices and more particularly to biasing circuits for insulated-gate field-effect semiconductor devices.

It is an object of this invention to provide an improved electrical circuit employing insulated-gate field-effect semi-conductor devices.

It is another object of the invention to provide an improved electrical circuit including an insulated-gate field-effect semiconductor device which provides direct current level setting without the requirement of additional diodes or like circuitry.

It is still another object of this invention to provide an improved synchronizing signal separator circuit for television receivers including an insulated-gate field-effect transistor.

It is a further object of this invention to provide an improved limiter circuit employing an insulated-gate field-effect semiconductor device.

An elecrtical circuit embodying the invention comprises an insulated-gate field-effect semiconductor device which has drain and source electrodes formed on a substrate of semi-conductor material in spaced relation, but connected by a channel of controllable conductivity. A gate electrode, insulated from the semiconductor substrate and the channel, is disposed between the first and second electrodes to control, by field-effect action, the effective conductivity of the channel. The source, gate and drain electrodes of the device are interconnected so that the device operates as the active element of the signal translating circuit, which may for example comprise a limiter or clipper circuit, an oscillator or the like. Means including a direct current circuit connection are provided between the gate and substrate electrodes to maintain the substrate electrode substantially at the potenial of the source electrode, so that gate voltage excursions in one polarity direction are clamped to substantially the potential of the source electrode by virtue of a rectifying action between the substrate and source electrodes. By connection of a suitable resistance-capacitance time constant network in the source-substrate circuit, a direct voltage is developed which is applied between the gate and source electrodes to control the operating point of the device as a function of signal level.

The novel features which are considered characteristic of the invention are set forth with particularity in the appended claims. The invention itself, however, both as to its organization and method of operation as well as additional objects and advantages thereof will best be understood from the accompanying drawing in which:

Figure 1:
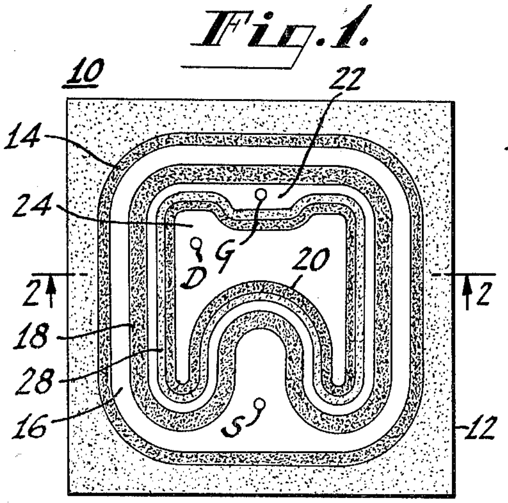
FIGURE 1 is a diagrammatic view of a field-effect transistor suitable for use in circuits embodying the invention.

Referring now to the drawings and particularly to FIGURE 1, a field-effect transistor 10 which may be used with circuits embodying the invention includes a body 12 of semi-conductor material. The body 12 may be either a single crystal or polycrystalline and may be of any suitable material used in the semiconductor art. For example, the body 12 may be nearly intrinsic silicon, such as for example lightly doped P-type silicon of 100 ohm. cm. material.

In the manufacture of a device shown in FIGURE 1, heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source-drain regions are to be formed.

Figure 2:
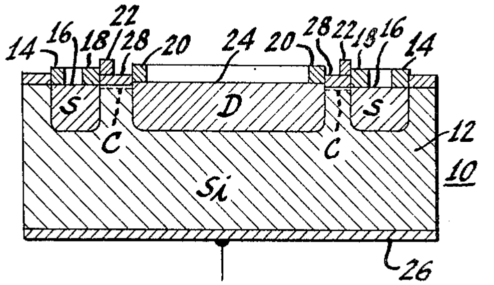
FIGURE 2 is a cross section view taken along section line 2—2 of FIGURE 1.

The body 12 is then heated in a suitable atmosphere such as in water vapor so that exposed silicon areas are oxidized to form grown silicon dioxide layers indicated by the stippled areas of FIGURE 1. During the heating process, impurities from the deposited silicon dioxide layer diffuse into silicon body 12 to form the source and drain regions. FIGURE 2, which is a cross section view taken along section line 2—2 of FIGURE 1, shows the source-drain regions labelled S and D respectively.

By means of another photo-resist and acid etching or like step the deposited silicon dioxide over part of the source-drain diffused regions are removed. Electrodes are formed for the source, drain and gate regions by evaporation of a conductive material by means of an evaporation mask. The conductive material evaporated may be chromium and gold in the order named, for example, but other suitable conductive materials may be used.

The finished wafer is shown in FIGURE 1, in which the stippled area between the outside boundary and the first dark zone 14 is grown silicon dioxide. The white area 16 is the conductive electrode corresponding to the source electrode. Dark zones 14 and 18 are deposited silicon dioxide zones overlying portions of the diffused source region and the dark zone 20 is a deposited silicon dioxide zone overlying a portion of the diffused drain region. White areas 22 and 24 are the conductive electrodes which correspond to the gate and drain electrodes respectively. The stippled zone 28 is a layer of grown silicon dioxide, on a portion of which the gate electrode 22 is placed, and which insulates the gate electrode 22 from the substrate silicon body 12 and from the source and drain electrodes as shown in FIGURE 2. The input resistance of the device at low frequencies is of the order of $10^{14}$ ohms. The silicon wafer is mounted on a conductive base or header 26 as shown in FIGURE 2. The layer of grown silicon dioxide 28 on which the gate electrode 22 is mounted, overlies an inversion layer or channel connecting the source and drain regions. The gate electrode 22 is displaced towards the source region S so that the distance between the source region S and the gate electrode 22 is smaller than the distance between the gate electrode 22 and the drain region D. If desired, the gate electrode may overlap the deposited silicon dioxide layer 18. Alternatively, the gate electrode may be symmetrically disposed between the source and drain regions.

The drain and source electrodes are connected to each other by a channel C. The electrons flow from source to drain in this thin channel region close to the surface. The conductive channel C is shown in FIGURE 2 in dotted lines.

It should be noted that the semiconductor wafer 12 may be of lightly doped N-type semiconductor material, and the source and drain regions of P-type material. The source electrode is defined as the electrode from which majority carriers flow, and the drain electrode as that electrode to which majority carriers flow. In the case of the device of FIGURES 1 and 2 with a P-type wafer and N-type source and drain regions the majority carriers are electrons which flow toward the terminal of positive potential. Accordingly, since the device is substantially symmetrical, the one of the electrodes 16 and 24 to which the positive potential of a supply source is applied operates as the drain electrode. If the device has an N-type substrate or wafer, the majority carriers are holes, and the electrode to which the negative terminal of a supply source is applied operates as the drain electrode.

Figure 3:
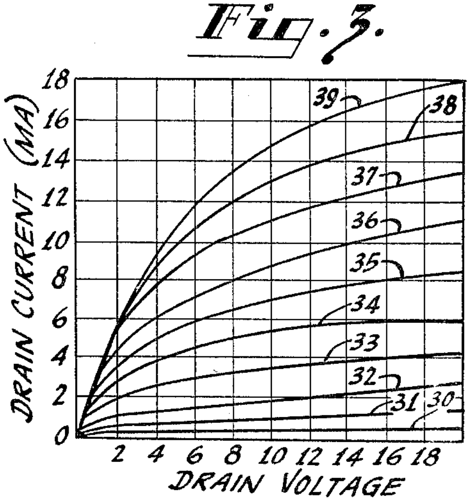
FIGURE 3 is a graph showing a family of drain current versus drain voltage curves, for various values of gate-to-source voltages for the transistor of FIGURE 1.

FIGURE 3 is a family of curves 30–39 illustrating the drain current vs. drain voltage characteristic of the transistor of FIGURES 1 and 2 for different values of gate-to-source voltage. It will be noted that the curves 38–39, representative of high drain current, and the curves 30–33, representative of relatively low drain current, are relatively closely spaced, whereas the intermediate curves 35–38 are relatively uniformly spaced. The equal spacing of the curves for equal gate-to-source voltage increments of voltage is indicative of a linear operating region for the transistor. A feature of an insulated-gate field-effect transistor is that the zero bias characteristic can be at any one of the curves 30–39 shown in FIGURE 3 with the curves above the zero bias curve representing positive gate voltages relative to the source, and the curves below the zero bias point representing negative gate voltages relative to the source.

The location of the zero bias curve can be selected by control of the processing of the transistor during its manufacture. For example, by controlling the time and/or temperature of the step of the process when the silicon dioxide layer 28 is grown, the number of free charge carriers in the device can be controlled. The longer the transistor is baked, and the higher the temperature, in a dry oxygen atmosphere, the more the drain current for a given amount of drain voltage for zero bias between the source and gate electrodes. By way of example, to establish the curve 36 as the zero bias curve, during the step which produces the silicon dioxide layer 28, the transistor was baked for two hours at 900° centigrade in an atmosphere of dry oxygen. If the temperature, or time of baking, or both are increased, the zero bias curve will correspond to one of the curves 37–39. By decreasing the temperature of time, or both, in the baking cycle the zero bias curve will occur for lower values of drain current such as for example one of the curves 30–35.

Figure 4:
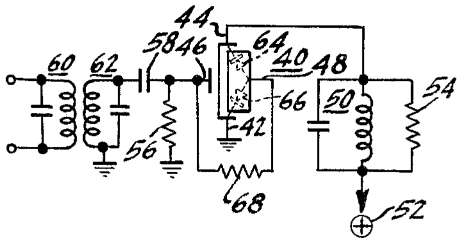
FIGURE 4 is a schematic circuit diagram of a limiter circuit embodying the invention.

Reference is now made to FIGURE 4 which is a schematic diagram of a limiter circuit including an insulated-gate field-effect transistor 40 similar to the one described in connection with FIGURES 1 and 2. The limiter circuit may, for example, comprise one of the stages in the intermediate frequency (IF) amplifier portion of a frequency modulation (FM) superhetrodyne receiver, for limiting the amplitude of an IF wave prior to its application to FM detector. The transistor 40 has a source electrode 42, a drain electrode 44, a gate electrode 46 and a substrate of semiconductor material 48. The source electrode 42 is connected to a point of reference potential shown as ground. The drain electrode 44 is connected through a tuned circuit 50 to the positive terminal of a source of bias potential 52, the negative terminal of which is connected to ground. The tuned circuit 50 is coupled to a suitable load indicated by a resistor 54.

The gate electrode 46 is biased to a desired bias potential for optimum signal translation from a source of bias potential through a resistor 56. In the present instance, no gate bias voltage is applied under steady state conditions, and accordingly the resistor 56 is connected between the gate electrode 46 and ground. Input signals are coupled to the gate electrode 46 through a coupling capacitor 58 from a signal source comprising the tuned primary circuit 60 and secondary circuit 62 of an intermediate frequency transformer.

A pair of rectifying junctions 64 and 66 effectively appear between the substrate electrode 48 and the drain and source electrodes 44 and 42, respectively. Since the transistor 40 has P-type impurities in the substrate, the substrate comprises the anode portion of the rectifying junctions and the source and drain electrodes operate respectively as the cathode portions of the rectifying junctions. If a transistor is used which has N-type impurities in the substrate, the rectifying junctions will be oppositely poled as will the poling of the potential supply source 52. The substrate electrode 48 is conductively connected for direct current to the gate electrode 46. The connection between the substrate and gate electrodes may comprise a wire or a resistor 68 as shown. If the connection between the gate and substrate electrodes is a wire, the resistor 68 which represents the spreading resistance (inherent series resistance) of the rectifying junction 66. The spreading resistance of the rectifying junction actually is measured between the substrate and source electrodes.

The transistor 40 is preferably selected as one whose zero gate-to-source bias characteristic provides the desired initial or quiescent operating point for the circuit. For example, the zero bias characteristic of the transistor 40 may correspond to the curve 36 of FIGURE 3, which is presumed to be at the approximate center of the linear operating or signal transfer characteristic of the transistor. The signal applied to the gate electrode 46 is translated by the circuit, which for small signals may operate as a common source Class A amplifier, and output signals are developed in the tuned drain circuit 50.

As the signal drives the gate electrode 46, and the substrate electrode 48, in the positive polarity direction, the rectifying junction 66 becomes conductive and tends to limit the positive going excursions of the signal as a function of the value of the resistor 68. The conduction of the rectifying junction 66 charges the capacitor 58, which on negative half cycles of the signal discharges through the resistor 56 thereby establishing a negative bias voltage between the gate electrode 46 and source electrode 42. The time constant of the resistor 56-capacitor 58 network is preferably made longer than the period of the IF wave supplied by the input circuit 62. Accordingly, the circuit including the rectifying junction 66 effectively operates as a peak detector circuit and clamps the positive peaks of the applied signals to substantially the potential of the source electrode 42, which is grounded.

As the signal level increases, the operating point of the transistor 40 moves successively from the curve 36 to the curves 35–34–33 etc. (see FIGURE 3). Hence, the negative going excursion of the stronger signals will drive the transistor 40 into cut-off more quickly. For still stronger signals, the transistor 40 may be cut off by the bias voltage developed in the peak detecting circuit for a substantial portion of the cycle of the input signal whereby a series of output pulses of current are derived from the drain electrode 44. These pulses of current will be regenerated as substantially a sine wave by the tuned output circuit 50.

If the transistor 40 is of the "depletion" type, i.e. has a zero bias characteristic corresponding to one of the curves 37–39 of FIGURE 3, a negative bias voltage must be applied to the gate electrode 46 relative to the source electrode 42 if the transistor is to operate at the center of its linear transfer characteristic. The appropriate bias voltage may be applied by connecting the gate electrode 46 through a resistor of suitable value (not shown) to the negative terminal of a source of operating potential, also not shown. The negative voltage at the gate electrode 46 is also applied to the substrate electrode and provides a "delay," or increased threshold before the rectifying junction 66 becomes conductive. Stated otherwise, the rectifying junction 66 will not conduct until the applied signal level is sufficiently large to overcome the negative bias voltage applied to the gate electrode. To reduce the amount of delay provided by such negative gate bias, a suitable potential supply source such as a battery, not shown, is connected in series with the resistor 68 between the source and substrate electrodes, with the battery polarized in a direction to hold the substrate electrode positive relative to the gate electrode.

As a further alternative of the circuit of FIGURE 4, if the transistor 40 is of the "enhancement" type, i.e. has a zero bias characteristic corresponding to one of the curves 30–35, a positive voltage applied to the gate electrode causes the transistor to operate at the center of its linear operating characteristic. The appropriate bias voltage may be applied by connecting the gate electrode 46 through a resistor of suitable value, not shown, to the positive terminal of a source of operating potential which may comprise the source 52. The positive voltage at the gate electrode 46 is also applied to the substrate electrode 48 and causes the rectifying junction 66 to conduct current under the steady state conditions. To prevent excessive bias current drain by the rectifying junction 66, and undesirable limiting of weak signals, a suitable potential supply source such as a battery is connected in series with the resistor 68 between the source and substrate electrodes. Of course, if no resistor is used, the battery is connected in series with the gate-substrate conductor. The above mentioned battery, which is not shown in the drawings, is polarized in a direction to hold the substrate electrode at negative potential relative to the gate electrode.

From the foregoing, it will be seen that the circuit of FIGURE 4 operates to provide substantial limiting of the signals above a certain threshold value, which are applied thereto. An important feature of the circuit is the means including a direct current circuit connecting the gate and substrate electrodes for maintaining the substrate and source electrodes at substantially the same potential. In the case of the circuit shown in FIGURE 4, the means comprises a transistor having the appropriate zero bias characteristic for small signal translation, and the connection between gate and substrate electrodes. In the cases where the transistor is of the enhancement of depletion types and the gate is maintained at a potential substantially different from zero relative to the source electrode, the means includes a potential supply source of appropriate value between the gate and source electrodes.

Figure 5:
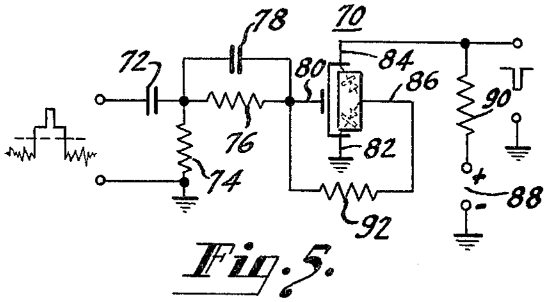
FIGURE 5 is a schematic circuit diagram of a synchronizing signal separator for television receivers embodying the invention.

The schematic circuit diagram of FIGURE 5 represents a synchronizing signal separator for television receivers. A source of composite television signals, such as a video amplifier stage, not shown, is coupled to a signal synchronizing stage 70 through a double time constant network which, as is known, enhances the immunity of the synchronizing signal separator to spurious noise impulses. One portion of the double time constant network comprises a series capacitor 72 and a shunt resistor 74 which are selected to provide a relatively long time constant. The second portion of the double time constant network comprises a parallel connected resistor 76 and capacitor 78 of relatively short time constant which are connected between the capacitor 72 and the gate electrode 80 of an insulated-gate field-effect transistor of the general type described in connection with FIGURES 1 and 2. The field-effect transistor includes a grounded source electrode 82, a drain electrode 84 and a substrate electrode 86. The drain electrode 84 is connected to the positive terminal of a potential supply source 88, not shown, through a load resistor 90. The separated synchronizing pulses are derived from across the resistor 90. The substrate electrode 86 is connected to the gate electrode 80 through a resistor 92 which may comprise the spreading resistance of the rectifying junction between the substrate electrode 86 and source electrode 82, or a physical external resistor.

The transistor included in the stage 70 is of the enhancement type, i.e. as a zero bias characteristic curve corresponding to the curve 30 of FIGURE 3. Hence, in the absence of signals substantially no drain current flows through the load resistor 90. Since the composite television signals are capacitively coupled to the synchronizing signal separator stage through the capacitor 72, the relative amplitude of the synchronizing pulses with respect to ground potential varies as a function of the picture content or brightness. In order to effectively separate the synchronizing pulses from the remainder of the composite signal it is desirable to refer the synchronizing pulse peak amplitude at a fixed potential. Ordinarily, in tube or junction transistor types of circuits the referencing of the synchronizing signal peaks is effected by the rectifying action between grid and cathode of a vacuum tube or base and emitter of the junction transistor. In operation, the synchronizing signal amplitude causes conduction of the base-emitter or grid-cathode path to clamp the peaks thereof to a fixed potential.

However, in synchronizing signal separator circuits of the type including an insulated-gate field-effect transistor, an extremely high impedance exists between the gate electrode and the other electrodes of the device. In order to effect the desired clamping action of the synchronizing signal peaks, the gate electrode is direct current conductively connected to the substrate electrode 86. When the composite signal is applied to the transistor, with a synchronizing signal excursion in the positive polarity direction, the rectifying junction between the substrate 86 and the source electrode 82 conducts clamping the synchronizing peaks appearing at the gate electrode to ground or to a potential more positive than ground depending upon the value of the resistance 92. The resistance 92 is large enough to permit the gate electrode to go sufficiently positive with respect to the source electrode to drive the transistor into substantially source-drain conduction.

When the synchronizing signal peaks cause the rectifying junction between the substrate electrode 86 and the source electrode 82 to conduct current, the capacitors 78 and 72 are charged. The discharge of these capacitors through resistors 76 and 74 respectively bias the gate electrode 80 negatively relative to ground as a function of the peak amplitude of the synchronizing pulses. The larger the peak amplitude of the synchronizing pulses, the further the transistor is driven into cut-off. Hence, the transistor is automatically maintained cut off except during the synchronizing pulse interval even though the average amplitude or picture content of the composite signal changes, and is thereby effective to separate the synchronizing pulses from the remainder of the composite signal.

If the transistor used in the circuit of FIGURE 5 provides substantial drain current under the zero gate bias condition, then a D.-C. voltage is applied between the gate and source electrodes so that substantially no drain current flows under no signal conditions. Accordingly a suitable potential supply source may be connected between the gate and substrate electrodes so that the substrate is maintained at substanially the same potential as the source electrode.

Figure 6:
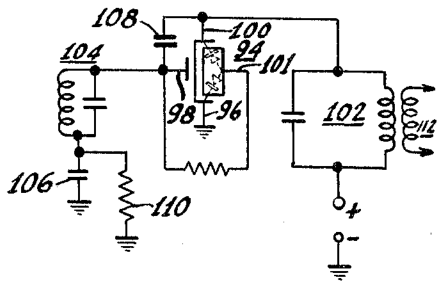
FIGURE 6 is a schematic circuit diagram of an oscillator circuit embodying the invention.

A further embodiment of the invention is shown in FIGURE 6 which represents a tuned-drain tuned-gate oscillator circuit. The oscillator circuit includes a transistor 94 having a source electrode 96, a gate electrode 98, a drain electrode 100 and a substrate electrode 101. The source electrode is connected to ground, and the drain electrode is connected through a resonant tank circuit 102 to the positive terminal of a source of operating potential, not shown. Oscillatory waves from the oscillator may be applied to a capacitor by a coupling winding 112 coupled to the tuned drain circuit 102.

The gate electrode 98 is coupled to a tuned gate circuit 104 and a capacitor 106, which is of low impedance at oscillator frequencies, to ground. The circuits 102 and 104 are tuned to the desired frequency of oscillation, with oscillation being sustained by regenerative feedback through a capacitor 108. The transistor 94 is selected to provide sufficient trans-conductance under zero bias conditions to be self starting. Accordingly, the gate electrode 98 is connected to ground through a gate bias resistor 110. If the transistor 90 does not exhibit sufficient transconductance so that the oscillator is self starting, then the resistor 110 is connected to a bias source to bias the gate electrode to a point where the transistor does exhibit the necessary transconductance.

Disregarding the direct current conductive connection between the gate electrode 98 and the substrate electrode 101, the amplitude of oscillation of the circuit shown in FIGURE 5 tends to be a function of the biasing between the gate electrode 98 and source electrode 96. Hence, the oscillator is not automatically self-adjusting in the face of load variations and the like, as are many tube or junction transistor oscillators. This lack of self-adjustment is because extremely high impedance exists between the gate electrode 98 and the source and drain electrodes 96 and 100. In order to permit the oscillator to be self-adjusting, the conductive connection provided between the gate electrode 98 and the substrate electrode 101 permits rectification of the positive oscillator signal swing occurring in the gate electrode 98 through the rectifying junction appearing at the substrate 101 and source electrode 96. This causes the bias at the gate electrode to become more negative with respect to ground until an equilibrium point has been established between the total loading on the oscillator and average conductance of the transistor over the cycle of the oscillatory wave. Hence, the amplitude of oscillation tends to remain substantially constant for fairly wide variations of oscillator loading.

What is claimed is:

1. An electrical circuit comprising:
an insulated-gate field-effect semiconductor device having source, gate and drain electrodes formed on a substrate of semiconductor material, and which has a rectifying junction between said substrate and source electrodes,
an input circuit including a resistor and a capacitor connected between said gate and source electrodes,
means including a direct current connection between said gate electrode and said semiconductor substrate for establishing said substrate at substantially the same potential as said source electrode under steady state conditions whereby voltage excursions at said gate electrode in one polarity direction are rectified by the rectifying junction appearing between said substrate and source electrodes, and
an output circuit connected to said drain electrode.

2. An electrical circuit as defined in claim 1 including a resistor connected between said gate and substrate electrodes.

3. An electrical circuit comprising:
an insulated-gate field-effect semiconductor device having source, gate and drain electrodes formed on a substrate of semiconductor material, and which has a rectifying junction between said substrate and source electrodes,
a signal input circuit coupled between said gate and source electrodes,
means providing a rectifying circuit comprising a direct current connection between said gate electrode and said semiconductor substrate for establishing said substrate at substantially the same potential as said source electrode under steady state conditions and a resistor connected between said gate and source electrodes whereby voltage excursions at said gate electrode in one polarity direction are rectified by the rectifying junction appearing between said substrate and source electrodes, and
an output circuit connected to said drain electrode.

4. An electrical circuit comprising:
an insulated-gate field-effect semiconductor device having source, gate and drain electrodes formed on a substrate of semiconductor material, and which has a rectifying junction between said substrate and source electrodes,
an input circuit including a resistor and a capacitor connected between said gate and source electrodes,
means including a direct current path connecting said gate electrode to said semiconductor substrate for establishing said substrate at substantially the same potential as said source electrode under steady state conditions whereby voltage excursions at said gate electrode in one polarity direction are rectified by the rectifying junction appearing between said substrate and source electrodes, and
said capacitor, direct current path, and rectifying junction between said substrate and source electrodes providing a charging circuit for said capacitor, said resistor providing a discharge path for said capacitor whereby a voltage is developed across said resistor the amplitude of which is a function of the peak amplitude of said voltage excursion, said voltage being effective to alter the efficiency of signal transfer by said transistor,
an output circuit connected to said drain electrode.

5. A limiter circuit including:
an insulated-gate field-effect semiconductor device having source, gate and drain electrodes formed on a substrate of semiconductor material, and which has a rectifying junction between said substrate and source electrodes, said device having a signal transfer characteristic at substantially zero gate-to-source bias voltage which provides Class A operation under steady state and small signal conditions,
a signal input circuit,
means capacitively coupling said signal input circuit between said gate and source electrodes,
means connecting a resistor between said gate and source electrodes so that substantially zero direct voltage exists between said gate and source electrodes under no signal conditions,
a direct current conductive connection between said gate and substrate electrodes, and
an output circuit coupled to said drain electrode.

6. A limiter circuit including:
an insulated-gate field-effect semiconductor device having source, gate and drain electrodes formed on a substrate of semiconductor material, and which has a rectifying junction between said substrate and source electrodes,
a signal input circuit,
means including a capacitor for coupling said signal input circuit between said gate and source electrode,
biasing circuit means including a resistor connected between said gate and source electrodes to bias said device for Class A operation under weak signal conditions,
means providing a direct current connection between said gate and substrate electrodes and for maintaining said substrate electrode at substantially the potential of said source electrode, the time constant of said resistor and capacitor together with the rectifying junction between said source and substrate electrodes providing a peak detector circuit for developing a direct voltage across said resistor as a function of the level of applied signals, and
an output circuit coupled to said drain electrode.

7. A synchronizing signal separator circuit including:
an insulated-gate field-effect semiconductor device having source, gate and drain electrodes formed on a substrate of semiconductor material, and which has a rectifying junction between said substrate and source electrodes, said device having substantially no drain current at zero gate-to-source bias voltage, a signal input circuit for a composite signal including synchronizing pulses, means including a capacitor for coupling said signal input circuit between said gate and source electrodes, means connecting a resistor between said gate and source electrodes, a direct current connection between said gate and substrate electrodes, the time constant of said resistor and capacitor together with the rectifying junction between said source and substrate electrodes providing a peak detector circuit for developing a direct voltage across said resistor as a function of the peak amplitude of said synchronizing pulses, and an output circuit coupled to said drain electrode.

8. A synchronizing signal separtor including:

an insulated-gate field-effect semiconductor device having source, gate and drain electrodes formed on a substrate of semiconductor material, and which has a rectifying junction between said substrate and source electrodes, a signal input circuit, means including a capacitor coupling said signal input circuit between said gate and source electrodes, biasing circuit means including a resistor connected between said gate and source electrodes to bias said device for substantially zero drain current under no signal conditions, means providing a direct current connection between said gate and substrate electrodes, and for maintaining said substrate electrode at substantially the same potential as said source electrode, the time constant of said resistor and capacitor together with the rectifying junction between said source and substrate electrodes providing a peak detector circuit for developing a direct voltage across said resistor as a function of the peak amplitude of said synchronizing pulses, and an output circuit coupled to said drain electrode.

9. An oscillatory circuit comprising:

an insulated-gate field-effect semiconductor device having source, gate and drain electrodes formed on a substrate of semiconductor material, and which has a rectifying junction between said substrate and source electrodes, means including a resistor connected between said gate and source electrodes for connecting said device as the active element of said oscillator circuit, and means including a direct current path connecting said gate electrode to said semiconductor substrate whereby voltage excursions at said gate electrode in one polarity direction are rectified by the rectifying junction appearing between said substrate and source electrodes.

10. An electrical circuit comprising:

an insulated-gate field-effect semiconductor device having source, gate and drain electrodes formed on a substrate of semiconductor material, and which has a rectifying junction between said substrate and source electrode, an input circuit means connected between said gate and source electrodes, said input circuit means including a resistor connected between said gate and source electrodes and a capacitor and a signal source connected in series between said gate and source electrodes, biasing means connected between said gate electrode and said substrate, said biasing means including a direct current path between said gate electrode and said substrate to establish said substrate and substantially the same potential as said source electrode under quiescent operating condition, whereby input signals to the gate electrode of one polarity are rectified by the rectifying junction between said substrate and source electrode, said direct current path, said bias means and rectifying junction between said substrate and said source electrode providing a charging circuit for said series capacitor, said resistor providing a discharge path for said capacitor having a time constant that is greater than the repetition period of the applied input signal, whereby a biasing voltage is developed across said resistor the amplitude of which is a function of said peak amplitude of said input signal so that said biasing voltage developed across said resistor provides a gate-to-source bias that is proportional to the input signal strength, and an output circuit means including a source of energizing potential connected between said drain and source electrodes.

11. An oscillatory circuit comprising:

an insulated-gate field-effect semiconductor device having source, gate and drain electrodes formed on a substrate of semiconductor material, and which has a rectifying junction between said substrate and said said source electrode, means including a resonant input circuit and a resistor connected between said gate and source electrodes, means including a resonant output circuit and a source of energizing potential connected between said drain and source electrode, regenerative coupling means connecting said resonant input circuit means to said output circuit means, biasing means including a direct current path connecting said gate electrode to said semiconductor substrate so that the voltage excursions at said gate electrode in one polarity direction are rectified between the rectifying junction appearing between said substrate and source electrode, whereby said input resonant circuit means forms a biasing network that biases said gate with respect to said source electrode as a function of the amplitude of the voltage oscillations at said gate electrode.

References Cited by the Examiner

UNITED STATES PATENTS

| | | | |
|---|---|---|---|
| 2,388,544 | 11/1945 | Holst et al. | 329—134 |
| 2,744,970 | 5/1956 | Shockley | 317—235 |
| 2,777,065 | 1/1957 | Pritchard | 331—117 |
| 2,778,956 | 1/1957 | Dacey et al. | 307—88.5 |
| 2,845,487 | 7/1958 | Massman | 178—7.35 |
| 2,900,531 | 8/1959 | Wallmark | 317—234 |
| 2,977,414 | 3/1961 | Adler et al. | 331—117 |

OTHER REFERENCES

Field Effect Transistor Circuit Design, by Huang et al., in Electronic Design, October 1955, pp. 42–45.

NATHAN KAUFMAN, *Primary Examiner.*

J. KOMINSKI, *Assistant Examiner.*